United States Patent
Iwai et al.

(10) Patent No.: US 7,215,693 B2
(45) Date of Patent: *May 8, 2007

(54) SURFACE EMITTING SEMICONDUCTOR LASER DEVICE

(75) Inventors: Norihiro Iwai, Tokyo (JP); Tatsuyuki Shinagawa, Tokyo (JP); Noriyuki Yokouchi, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 249 days.

This patent is subject to a terminal disclaimer.

(21) Appl. No.: 10/900,935

(22) Filed: Jul. 27, 2004

(65) Prior Publication Data

US 2005/0041713 A1 Feb. 24, 2005

(51) Int. Cl.
*H01S 5/00* (2006.01)

(52) U.S. Cl. .............. 372/46.013; 372/50.1; 372/43.01

(58) Field of Classification Search ............ 372/43.01, 372/50.1, 46.013
See application file for complete search history.

(56) References Cited

U.S. PATENT DOCUMENTS

| | | |
|---|---|---|
| 4,426,701 A | 1/1984 | Botez |
| 4,647,953 A | 3/1987 | Okajima et al. |
| 5,379,314 A | 1/1995 | Nemoto et al. |
| 5,557,627 A | 9/1996 | Schneider et al. |
| 5,822,356 A | 10/1998 | Jewell |
| 5,956,361 A | 9/1999 | Ikeda et al. |
| 6,285,702 B1 | 9/2001 | Caprara et al. |
| 6,320,893 B1 | 11/2001 | Ueki |
| 6,839,369 B2 * | 1/2005 | Iwai et al. .............. 372/45.01 |

OTHER PUBLICATIONS

Iwai et al., High-Performance 1.3 μm In AsP Strained-Layer Quantum-Well ACIS (Al-Oxide Confined Inner Stripe) Lasers (1999) IEEE Journal of Selected Topics in Quantum Electronics vol. 5, No. 3, pp. 694-700.

* cited by examiner

*Primary Examiner*—Minsun Oh Harvey
*Assistant Examiner*—Delma R. Flores Ruiz
(74) *Attorney, Agent, or Firm*—Knobbe Martens Olson & Bear LLP

(57) ABSTRACT

A surface emitting semiconductor laser device including a substrate, a bottom DBR, and a mesa post having a layer structure, the layer structure including a top DBR including a plurality of pairs, each of said pairs including an Al-containing high-reflectivity layer and an Al-containing low-reflectivity layer, an active layer structure sandwiched between the DBRs for emitting laser, and a current confinement layer disposed within or in a vicinity of one of the DBRs, the current confinement layer including a central current injection area and an annular current blocking area encircling the central current injection area, the annular current blocking area being formed by selective oxidation of Al in an $Al_xGa_{1-x}As$ layer ($0.95 \leq x < 1$) having a thickness below 60 nm, the Al-containing low-reflectivity layer including Al at an atomic ratio not more than 0.8 and below 0.9. The progress of the oxidation in the Al-containing compound semiconductor layers can be suppressed during the formation of the current confinement oxide area by restricting the Al content in the specified range, thereby realizing the surface emitting semiconductor laser device having the longer lifetime, or the higher reliability.

4 Claims, 5 Drawing Sheets

SURFACE EMITTING SEMICONDUCTOR LASER DEVICE

BACKGROUND OF THE INVENTION

1. Field of the Invention

The present invention relates to a surface emitting semiconductor laser device with a current confinement oxide area, and more in particular to the surface emitting semiconductor laser device with the current confinement oxide area having a longer lifetime, or a higher reliability.

2. Description of the Related Art

A surface emitting semiconductor laser device emitting light in a direction perpendicular to a substrate attracts public attention in the data communication field because of the possible arrangement of a plurality of the laser devices in a two-dimensional array on a single substrate, different from a conventional Fabry-Perot semiconductor laser device.

The surface emitting semiconductor laser device includes a pair of DBRs (Distributed Bragg Reflector) (for example, Al(Ga)As/Ga(Al)As in the GaAs-based reflector) and an active layer acting as an emitting region sandwiched between the reflectors overlying a GaAs or InP substrate.

In order to increase the current injection efficiency and to reduce the threshold current, a surface emitting semiconductor laser device has been proposed having the current confinement structure formed by an Al oxide area.

For example, a GaInNAs-based material can be formed on the GaAs substrate, thereby providing a AlGaAs-based DBR mirror having an excellent thermal conductivity and a higher reflectivity. Accordingly, the mirror is promising in the surface emitting semiconductor laser device which emits light in a longer wavelength region from 1.2 to 1.6 μm.

As shown in FIG. 1, a conventional 850 nm-range surface emitting semiconductor laser device 10 includes a layer structure, overlying an n-GaAs substrate 12, having a bottom distributed Bragg reflector (hereinafter referred to as "DBR") mirror 14 having 35 pairs of n-$Al_{0.9}$GaAs/n-$Al_{0.2}$GaAs layers each having a thickness of λ/4n ("λ" is a lasing wavelength and "n" is a refractive index), a bottom cladding layer 16, a quantum well active layer 18, a top cladding layer 20 and a top DBR mirror 22 having 25 pairs of p-$Al_{0.9}$GaAs/p-$Al_{0.2}$GaAs each having a thickness of λ/4n.

In the top DBR mirror 22, one of the layers close to the active layer 18 is formed as an AlAs layer 24 in place of the $Al_{0.9}$GaAs layer, and Al of the AlAs layer 24 in the area other than a current injection area is selectively oxidized to form a current confinement area formed by an Al oxide area 25 which surrounds the current injection area.

The top DBR mirror 22 in the layer structure is configured to be a circular mesa post 23 having a diameter of 30 μm from the top to the layer near to the active layer 18 formed by the photolithographic and etching process.

The annular current confinement area made of the Al oxide area 25 is formed in the mesa post 23 by selectively oxidizing the Al in the AlAs layer 24 inwardly from the outer periphery of the mesa post 23 by means of the oxidation treatment of the layer structure at about 400° C. in a water vapor ambient. When, for example, the Al oxide area 25 includes an annular ring having a width of 10 μm, the surface area of the central AlAs area 24 or the surface area for the current injection (aperture) is about 80 μm$^2$ having a circular shape with a diameter of 10 μm.

The mesa post 23 is surrounded by, for example, a polyimide section 26, and a ring-shaped electrode acting as a p-side electrode 28 is mounted in contact with the periphery of the top surface of the mesa post 23 by the width from 5 μm to 10 μm. After the thickness of the n-GaAs substrate 12 is adjusted to about 200 μm by polishing the bottom surface thereof, an n-side electrode 30 is formed thereon.

An electrode pad 32 for connection with an external terminal is mounted on the polyimide section 26 and in contact with the ring-shaped electrode 28.

In the conventional current confinement oxide layer structure, the conversion of the AlAs layer into the Al oxide area by the oxidation contracts the volume thereof to generate stress in the compound semiconductor layers adjacent to the Al oxide area. Thereby, the active layer is deteriorated to reduce the lifetime of the device because the active layer exists in the vicinity of the Al oxide area.

Thus, in order to prevent reduction of the device lifetime, use of an $Al_{0.98}Ga_{0.02}$As layer containing a smaller amount of gallium (Ga) has been proposed in place of the AlAs layer. Further, the prevention of the stress is attempted by decreasing the thickness of the AlAs layer to about 40 nm.

However, the oxidation rate is reduced by one order compared with that of the AlAs layer having an ordinary thickness of 60 nm when the $Al_{0.98}Ga_{0.02}$As layer or the thinner AlAs layer is used.

Accordingly, in order to obtain the Al oxide area having the same width in the $Al_{0.98}Ga_{0.02}$As layer or the thinner AlAs layer, the time of the oxidation should be increased or the oxidation temperature should be elevated.

As a result, as shown in FIG. 2, a problem arises that the $Al_{0.9}Ga_{0.1}$As layer having the higher Al content or the lower refractive index layer in the DBR mirror is oxidized in the annular shape along the periphery of the mesa post because the top DBR mirror is exposed to the severe oxidation conditions during the oxidation of the AlAs layer (current confinement layer).

The width of the oxide area formed in the DBR mirror depends on the oxidation conditions including the composition and the thickness of the Al oxide area for the current confinement and the composition and the thickness of the compound semiconductor layers in the DBR mirror, and at least about 2 to 5 μm is inevitably oxidized.

Although the oxidation amount of about 2 to 5 μm is smaller with respect to the diameter of the mesa post, the volume contraction is large enough to be neglected because the number of the $Al_{0.9}Ga_{0.1}$As layers constituting the DBR mirror is large and each of the layers has an increased film thickness even if the oxide width is only several μm. The stress generated due to the volume contraction may adversely influence the reliability of the surface emitting semiconductor laser device.

Since the thickness of the DBR mirror is λ/4n, the influence increases with the increase of the wavelength of the surface emitting semiconductor laser device.

Further, as shown in FIG. 3, when a force is applied to the mesa post in the direction of the arrow shown therein, the stress is generated on the boundary between the AlAs layer 24 and the Al oxide area 25 or the vicinity of the front edge of the Al oxide area 25 (near to the center of the mesa post, a region "C" shown in FIG. 3).

Actually, the specimen of the surface emitting semiconductor laser device which was compulsorily deteriorated through the reliability test was observed with a transmission electro-microscope to confirm the occurrence of rearrangement around the region "C" in FIG. 3.

The factors exerting the stress on the surface emitting semiconductor laser device includes the external factor and the internal factor. The external factors includes, for example, a dielectric, a protection film made of polyimide and an electrode. Further, in the mounting step of the surface emitting semiconductor laser device, the various forces may be applied to the mesa post.

The internal factor includes a distortion generated in the layer film after the crystal growth. Especially, the thickness of the layer structure having the top and bottom DBR mirrors amounts to 10 μm in the surface emitting semiconductor laser device, and the distortion in the layer structure including the compound semiconductor layers is not negligible.

Further, since the thickness of the compound semiconductor layers is established to be ¼n (wherein "n" is a refractive index) times the wavelength, the thickness of the DBR mirror is increased in the surface emitting semiconductor laser device having a longer wavelength range of 1.2 to 1.6 μm. The thickness of the layer structure increases with the increase of the DBR mirror to increase the distortion, thereby significantly exerting the adverse influence to the lifetime of the surface emitting semiconductor laser device.

A countermeasure for improving the device reliability includes the reduction of the stress applied to the front edge of the Al oxide area.

SUMMARY OF THE INVENTION

It is an object of the present invention to provide a surface emitting semiconductor laser device having a reliability obtained by reducing distortion or stress.

In a first aspect of the present invention (hereinafter referred to as "first invention), a surface emitting semiconductor laser device is provided which includes a substrate, a bottom DBR overlying the substrate, and a mesa post overlying the bottom DBR and having a layer structure, the layer structure including a top DBR including a plurality of pairs, each of said pairs including an Al-containing high-reflectivity layer and an Al-containing low-reflectivity layer, an active layer structure sandwiched between the DBRs for emitting laser, and a current confinement layer disposed within or in a vicinity of one of the DBRs, the current confinement layer including a central current injection area and an annular current blocking area encircling the central current injection area, the annular current blocking area being formed by selective oxidation of Al in an $Al_xGa_{1-x}As$ layer ($0.95 \leq x < 1$) having a thickness below 60 nm, the Al-containing low-reflectivity layer including Al at an atomic ratio not more than 0.8 and below 0.9.

In accordance with the first invention, the progress of the oxidation in the Al-containing compound semiconductor layers can be suppressed during the formation of the current confinement oxide area by restricting the Al content in the specified range, thereby realizing the surface emitting semiconductor laser device having the longer lifetime, or the higher reliability.

In a second aspect of the present invention (hereinafter referred to as "second invention), a surface emitting semiconductor laser device is provided which includes a substrate, a bottom DBR overlying the substrate, and a mesa post overlying the bottom DBR and having a layer structure, the layer structure including a top DBR including a plurality of pairs, each of the pairs including an Al-containing high-reflectivity layer and an Al-containing low-reflectivity layer, an active layer structure sandwiched between the DBRs for emitting laser, and a current confinement layer disposed within or in a vicinity of one of the DBRs, the current confinement layer including a central current injection area and an Al-oxidized annular current blocking area encircling the central current injection area, wherein the following relation holds:

$$a/b > 0.6; \text{ and}$$

$$b \geq 2 \, \mu m$$

where the "a" is a distance between the current confinement layer and top of the mesa post, and the "b" is a width of the Al-oxidized annular current blocking area.

In accordance with the second invention, the height from the Al oxide layer to the highest layer of the mesa post ("a") and the width of the Al oxide layer ("b") are established to satisfy the specified relation, thereby reducing the stress concentrated on the front edge of the Al oxide area to realize the surface emitting semiconductor laser device having the improved reliability.

The above and other objects, features and advantages of the present invention will be more apparent from the following description.

PREFERRED EMBODIMENTS OF THE INVENTION

In the first invention, the Al content of the compound semiconductor layer constituting the multi-layer film reflector is between 0.8 and 0.85 inclusive, and the side oxidation of the multi-layer film reflector is below 2.5 μm from the outer periphery of the mesa post. The diameter of the mesa post is preferably between 30 and 40 μm inclusive.

The oxide width having such a value does not exert the adverse effect on the lifetime of the surface emitting semiconductor laser device.

The first invention can be applied to any surface emitting semiconductor laser device having the current confinement oxide layer and the multi-layer film reflector formed by the compound semiconductor layers containing the Al, especially to that having the multi-layer film reflector of $Al_xGa_{1-x}As/Al_xGa_{1-x}As$ overlying the GaAs substrate regardless of the material of the active layer and the emitting wavelength.

In the preferred embodiment of the first invention, the active layer structure having the emitting wavelength range of 850 nm or 1200 to 1600 nm overlies the GaAs substrate.

In connection with the second invention, the present inventors have investigated the relation between the force and the width of the Al oxide area, and the force is exerted on the boundary between the Al oxide area and the original AlAs layer or exerted on the front edge of the Al oxide area.

The relation will be described referring to FIG. 4 in which the height from the Al oxide layer to the highest layer of the mesa post ("a") and the width of the Al oxide layer ("b") are indicated.

Figure 4:
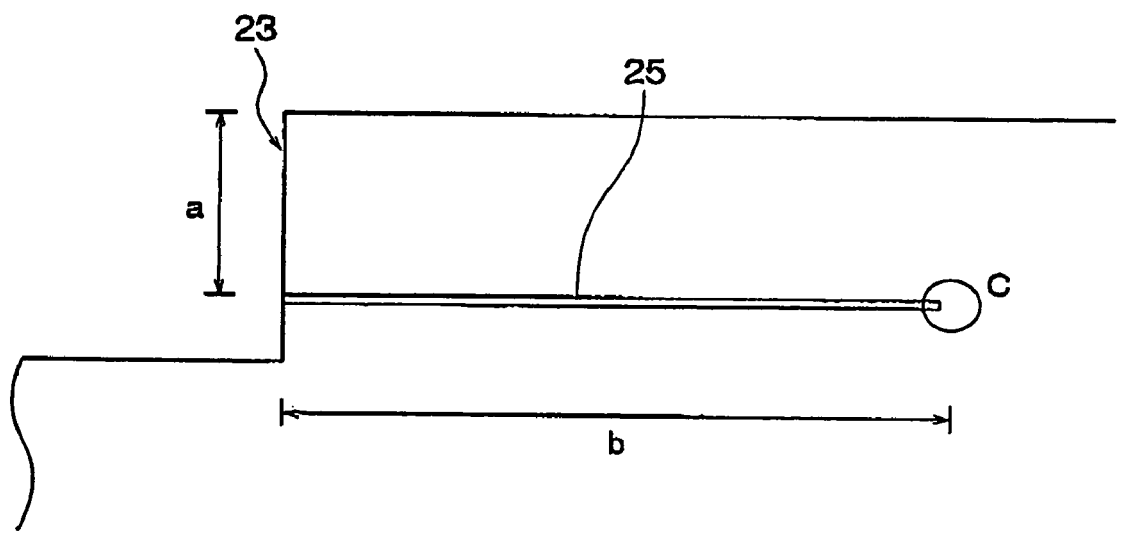
FIG. 4 a schematic view showing the relation between the height from the Al oxide layer to the highest layer of the mesa post ("a") and the width of the Al oxide layer ("b").

As shown in FIG. 4, the force applied to the point "C" increases with the increase of the width "b" in accordance with the principle of lever if the force applied on the outer periphery of the mesa post. When the "a" is larger, the force applied to the point "C" increases if the force applied on the highest layer of the mesa post.

In the above-described 850 nm-range surface emitting semiconductor laser device (corresponding to 25 pairs of $Al_{0.9}Ga_{0.1}As/p-Al_{0.2}Ga_{0.8}As$), the "a" is preferably about 3.2 μm and the "b" is preferably about 10 μm.

In the meantime, the reduction of the "b" which can decrease the force applied to the front edge "C" of the Al oxide area wrongfully decreases the optical confinement effect to lower the threshold current and the current injection efficiency.

However, in accordance with the present inventors' investigation by using the specimen of the edge surface emitting semiconductor laser device, the optical or current confinement function was not deteriorated when the width of the Al oxide area was 2 μm or more as described in N. Iwai et. al, IEEE J. Select. Topics Quantum Electron., 5,(1999), 694.

Based on the above, the optimum range of the width "b" is 2 and 5 μm inclusive when the width "a" is 3.2 μm (850 nm range). However, the permitted range of the "b" increases with the increase of the "a".

The present inventors have found that, after the repeated experiments, the relation of a/b>0.6 is required to improve the reliability.

For example, in the surface emitting semiconductor laser device with the wavelength of 1300 nm having the width "a" of about 5 μm, the width "b" may be 8.33 μm or less. Further, in the surface emitting semiconductor laser device with the wavelength of 1550 nm having the width "a" of about 6 μm, the width "b" may be 10 μm or less.

The configuration of a surface emitting semiconductor laser device in accordance with embodiments of the present invention will be described referring to the annexed drawings.

Embodiment 1

Figure 1:
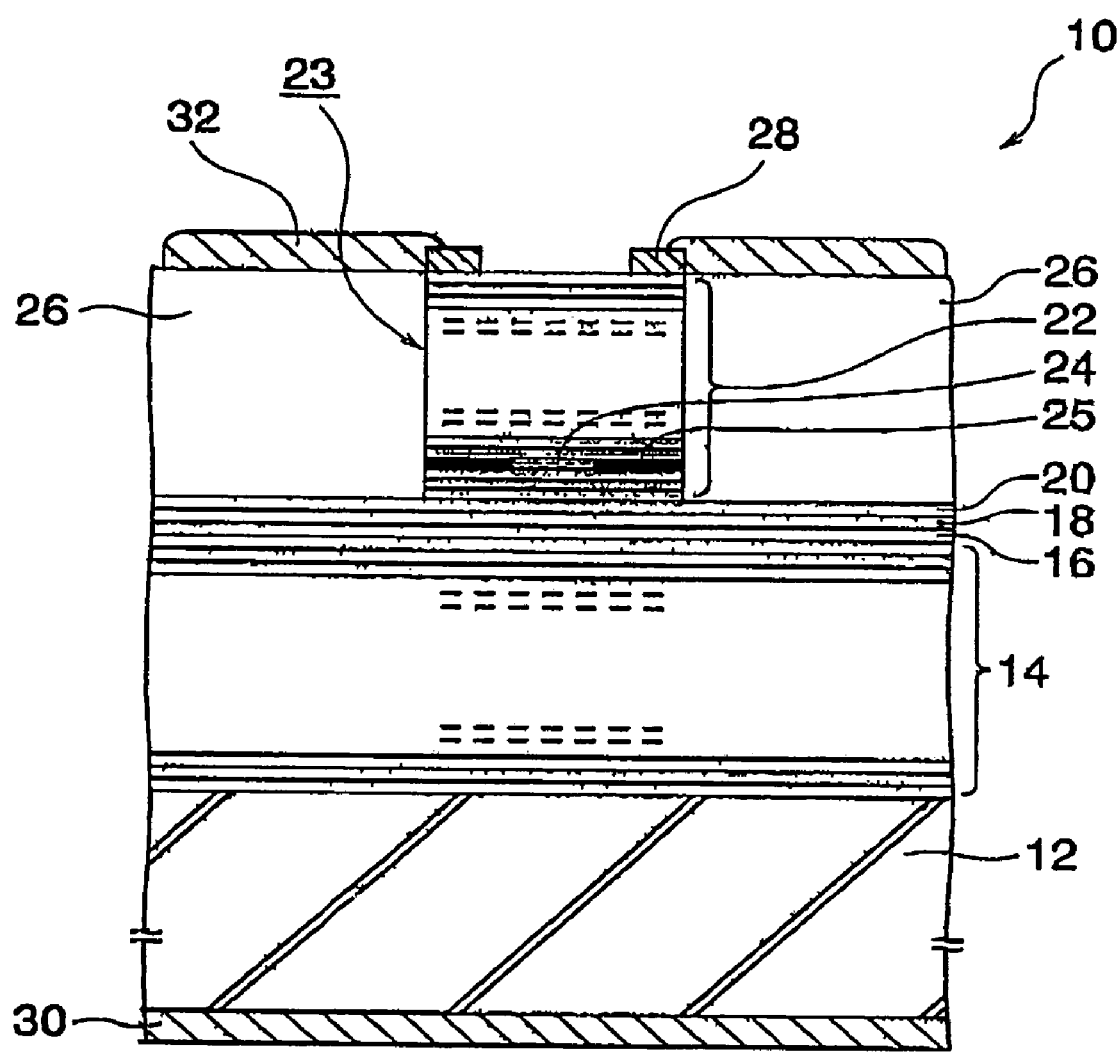
FIG. 1 is a sectional view showing a conventional surface emitting semiconductor laser device.
Figure 2:
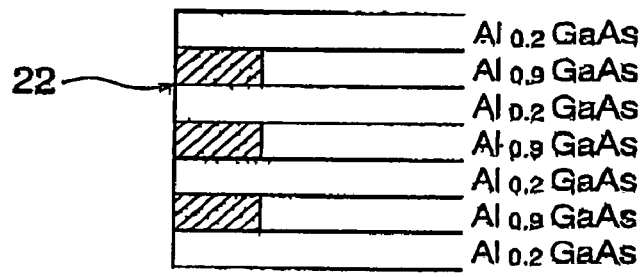
FIG. 2 is a schematic sectional view showing the progress of the oxidation of compound semiconductor layers forming a conventional DBR mirror.
Figure 5:
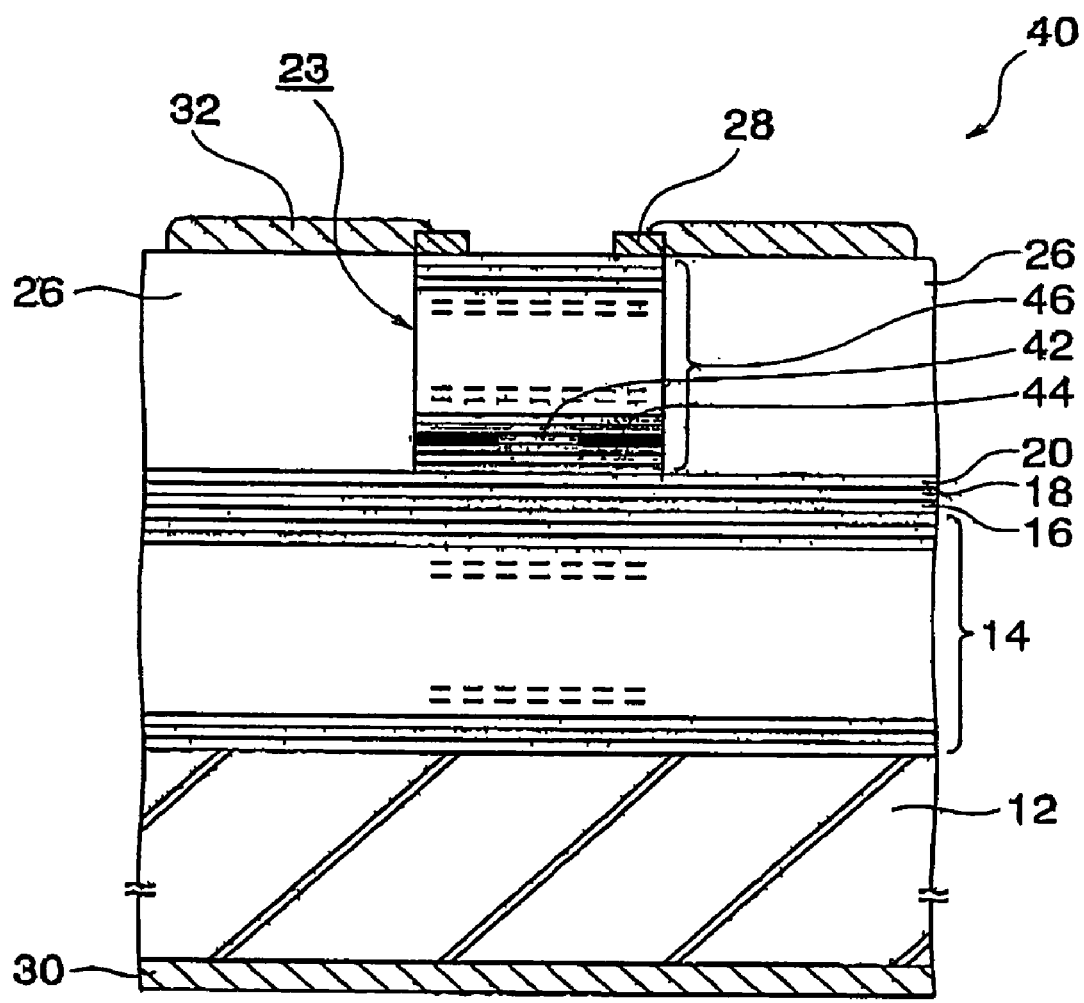
FIG. 5 is a sectional view showing a surface emitting semiconductor laser device in accordance with Embodiments of the present invention.

As shown in FIG. 5, a surface emitting semiconductor laser device 40 of Embodiment 1 includes substantially the same configuration as that of the conventional surface emitting semiconductor laser device 10 of FIG. 1 except that an Al-containing layer to be oxidized for forming an Al oxide area constituting a current confinement structure is an $Al_{0.98}Ga_{0.02}As$ layer (central current injection area) 42 having a thickness of 60 nm in place of the AlAs layer 24 of FIG. 1, an Al oxide area (annular current blocking area) 44 is formed by selectively oxidizing Al in the $Al_{0.98}Ga_{0.02}As$ layer, and a multi-layer film reflector constituting a DBR mirror 46 includes 25 pair of $p-Al_{0.85}Ga_{0.15}As/p-Al_{0.2}Ga_{0.08}As$ in place of the 25 pair of $p-Al_{0.9}GaAs/p-Al_{0.2}GaAs$ of FIG. 1.

In Embodiment 1, the stress between the Al oxide area 44 and the adjacent $p-Al_{0.2}Ga_{0.8}As$ layer 42 is reduced by using the $p-Al_{0.85}Ga_{0.15}As$ layer as the Al-containing layer to be oxidized, thereby increasing the device lifetime. Further, the oxide width of the $p-Al_{0.85}Ga_{0.15}As$ layer constituting the DBR mirror 46 is made to be 2.5 μm or less, thereby further increasing the device lifetime and the reliability of the device.

An $Al_XGa_{1-X}As$ $(0.95 \leq X \leq 1)$ layer having a thickness below 60 nm can be used as the Al-containing layer to be oxidized.

Embodiment 2

As shown in FIG. 5, a surface emitting semiconductor laser device 40 of Embodiment 2 includes substantially the same configuration as that of the conventional surface emitting semiconductor laser device 10 of FIG. 1 except that an Al oxide area 42 is used having a width between 2 and 5 μm inclusive, for example 5 μm, in place of the Al oxide area 25 having the width of 10 μm in FIG. 1, and the diameter of a mesa post is 20 μm for making the diameter of a central AlAs layer 44 or the diameter of a current injection region (aperture) to be 10 μm.

In Embodiment 2, the height "a" from the Al oxide area 42 to the highest layer of the mesa post 23 is 3.2 μm.

When the surface emitting semiconductor laser device has an emitting wavelength range of 1300 nm, the width of the Al oxide layer ("b") is 8.3 μm≧b≧2 μm because the height from the Al oxide layer to the highest layer of the mesa post ("a") is about 5 μm.

When the surface emitting semiconductor laser device has an emitting wavelength range of 1550 nm, the "b" is 10 μm≧b≧2 μm because the "a" is about 6 μm.

EXAMPLE 1

Surface emitting semiconductor laser devices having DBR mirrors with various oxide widths were fabricated by using, as a compound oxide layer for forming an Al oxide area for the current confinement, an $Al_{0.9}GaAs$ layer or an AlAs layer having a thinner thickness below 60 nm followed by the conversion thereof into the Al oxide areas under various oxidation conditions. The relation between the oxide width (of the layer having a higher Al content) of the DBR mirror and the lifetime of the surface emitting semiconductor laser device was investigated by a life test thereof conducted at 85° C. The device lifetime was defined to be a period of time from initial to a point at which the optical output was reduced by 2 dB under the operation with the specified driving current injection.

Figure 6:
FIG. 6 is a graph indicating the relation between a device lifetime and the oxide width of a DBR mirror in Example 1.

The results shown in a graph of FIG. 6 indicate that the device lifetime could be increased by reducing the oxide width of the DBR mirror. Further, the practically required device lifetime, or the reliability of the surface emitting semiconductor laser device, could be obtained by suppressing the oxide width of the DBR mirror to be 2.5 μm or less.

EXAMPLE 2

The present inventors have investigated a method of reducing the oxide width of the DBR mirror.

The oxidation rate of the $Al_XGa_{1-X}As$ layers forming the DBR mirror depends on the Al content "X", and increases with the increase of the Al content "X". Accordingly, the reduction of the oxide width can be achieved by reducing the Al content "X" and increasing the oxidation selectivity of the AlAs layer. However, the reduction of the Al content "X" decreases the difference of the refractivities between the $Al_XGa_{1-X}As$ layer and the other $Al_XGa_{1-X}As$ layer. For maintaining the specified reflectivity, the number of the pairs of the DBR mirrors should be increased, thereby elevating the fabrication cost.

In this manner, the Al content "X" of the DBR mirror and the number of the pairs of the DBR mirrors or the fabrication cost are in the inverse proportion.

In Example 2, the relation of the relative oxidation rate was investigated between the $Al_{0.98}GaAs$ layer or the AlAs layer having a thinner thickness below 60 nm acting as the compound semiconductor layer for forming the Al oxide area for the current confinement and the Al content "X" constituting the DBR mirror. The results are shown in a graph of FIG. 7 in which the abscissa indicates the Al content "X" in the AlGaAs layer and the ordinate indicates the relative oxidation rate with respect to the standardized oxidation rate of AlAs of 1.0 (Al content is 1.0), thereby showing the relation between the Al content "X" and the oxidation rate.

Figure 7:
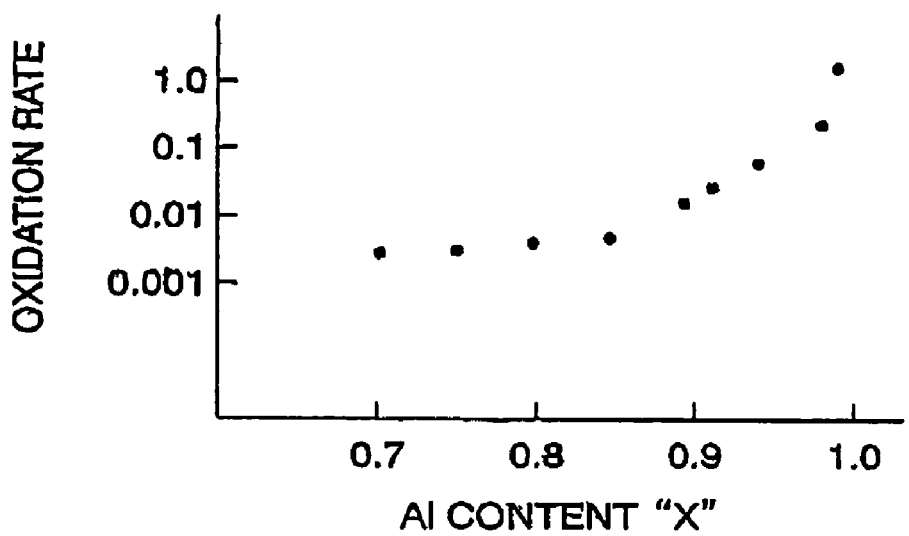
FIG. 7 is a graph indicating the relation between an oxidation rate and an Al content "X" in Example 2.

It is apparent from FIG. 7 that the oxidation rate is nearly constant in the Al content "X" not more than 0.85, or it can be concluded that the optimum value of the Al content "X" in the AlGaAs layer is in the range having the higher Al content "X" and having the higher selectivity of the oxidation rate, or the range from 0.8 to 0.85. Accordingly, the maximum value of the Al content "X" in which the oxidation rate is not increased is 0.85.

While the graph of FIG. 7 shows the relation between the Al content "X" and the oxidation rate of the AlGaAs layer, the relation is also applicable to the oxidation of the compound semiconductor layer containing Al.

EXAMPLE 3

The reliability test of the surface emitting semiconductor laser device was conducted by intentionally exerting the force on the point "C" under the conditions that a temperature was 100° C. and the injection current was 200 mA in the ACC driving.

The device lifetime was defined to be a period of time from initial to a point at which the optical output was reduced by 2 dB.

Figure 8:
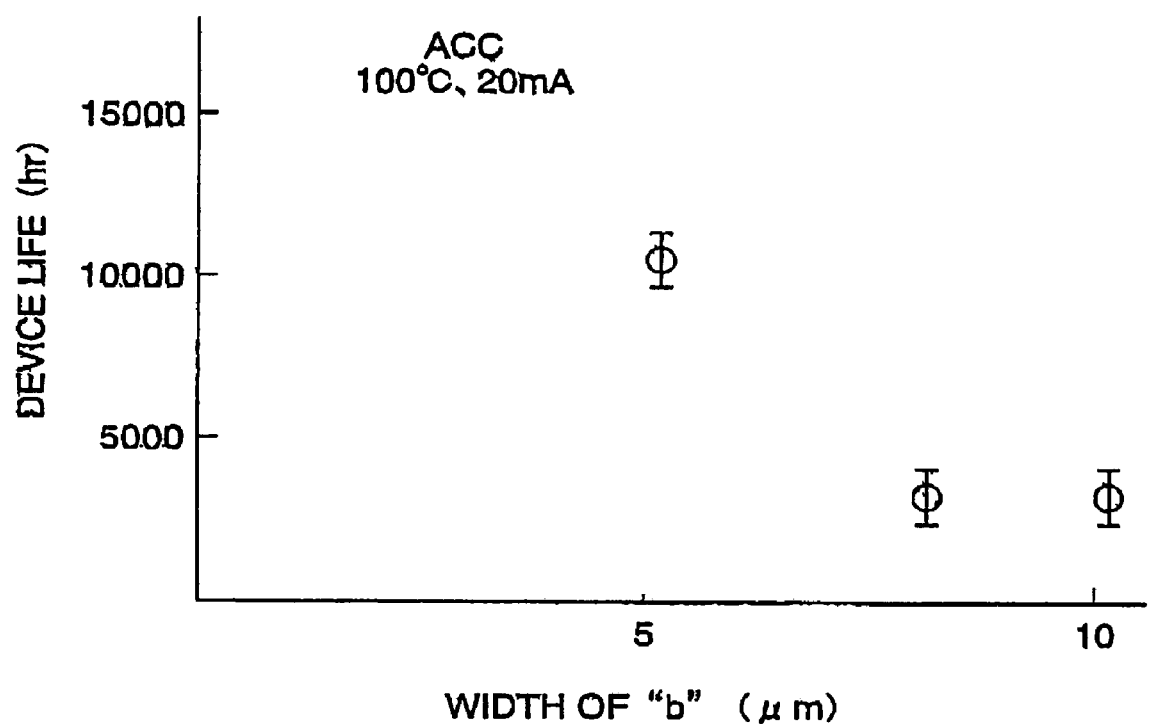
FIG. 8 is a graph indicating the relation between the device lifetime and the width "b" in Example 3.

The results are shown in a graph of FIG. 8 in which the ordinate indicates the device lifetime of the test and the abscissa indicates the width of the oxide layer. The device lifetime was nearly constant when the "b" was 8 to 10 μm. However, the device reliability was largely improved when the width "b" was 5 μm.

Figure 3:
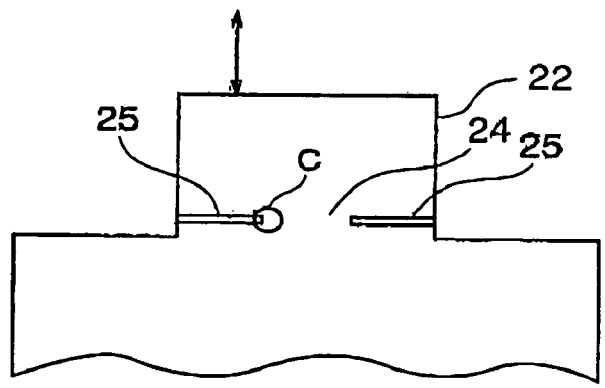
FIG. 3 is a schematic view showing the stress concentrated on the front edge of an Al oxide area when a force is applied to a mesa post.

This is because, as shown in FIG. 3, the reduction of the width "b" decreases the force applied to the front edge "C" of the Al oxide area. The device reliability is elevated when the width "b" is made to be 5 μm or less.

Since the above embodiment is described only for examples, the present invention is not limited to the above embodiment and various modifications or alterations can be easily made therefrom by those skilled in the art without departing from the scope of the present invention.

What is claimed is:

1. A surface emitting semiconductor laser device comprising a substrate, a bottom DBR overlying the substrate, and a mesa post overlying the bottom DBR and having a layer structure, the layer structure including a top DBR including a plurality of pairs, each of the pairs including an Al-containing high-refractive index layer and an Al-containing low-refractive index layer, an active layer structure sandwiched between the DBRs for emitting laser, and a current confinement layer disposed within or in a vicinity of one of the DBRs, the current confinement layer including a central current injection area and an Al-oxidized annular current blocking area encircling the central current injection area, wherein the following relation holds:

$a/b > 0.6$; and $b \geq 2$ μm where the "a" is a distance between the current confinement layer and top of the mesa post, and the "b" is a width of the Al-oxidized annular current blocking area.

2. The surface emitting semiconductor laser device as defined in claim 1, wherein the active layer structure has an emission wavelength of 850 nm range, and the "b" satisfies 5 μm $\geq$ b $\geq$ 2 μm.

3. The surface emitting semiconductor laser device as defined in claim 1, wherein the active layer structure has an emission wavelength of 1300 nm range, and the "b" satisfies 8.3 μm $\geq$ b $\geq$ 2 μm.

4. The surface emitting semiconductor laser device as defined in claim 1, wherein the active layer structure has an emission wavelength of 1550 nm range, and the "b" satisfies 10 μm $\geq$ b $\geq$ 2 μm.

* * * * *

UNITED STATES PATENT AND TRADEMARK OFFICE
CERTIFICATE OF CORRECTION

PATENT NO. : 7,215,693 B2 Page 1 of 1
APPLICATION NO. : 10/900935
DATED : May 8, 2007
INVENTOR(S) : Iwai et al.

It is certified that error appears in the above-identified patent and that said Letters Patent is hereby corrected as shown below:

Title Page, insert the following:

-- Related U.S. Application Data

(63)  Continuation of application No. 10/184,522, filed on June 26, 2002, now Pat. No. 6,839,369. --.

Title Page, insert the following:

-- (30)   Foreign Application Priority Data

Jun. 26, 2001　(JP) ................................ 2001-192304
　　Jul. 23, 2001　(JP) ................................ 2001-221026 --.

In Column 5, Line 62, please delete "$Al_{0.2}Ga_{0.08}As$" and insert -- $Al_{0.2}Ga_{0.8}As$ --, therefor.

Signed and Sealed this

Ninth Day of June, 2009

JOHN DOLL
*Acting Director of the United States Patent and Trademark Office*